United States Patent [19]

Cobaugh et al.

[11] 4,362,353

[45] Dec. 7, 1982

[54] CONTACT CLIP FOR CONNECTING A CERAMIC SUBSTRATE TO A PRINTED CIRCUIT BOARD

[75] Inventors: Robert F. Cobaugh, Elizabethtown; Norwood C. Graeff, Harrisburg, both of Pa.

[73] Assignee: AMP Incorporated, Harrisburg, Pa.

[21] Appl. No.: 153,514

[22] Filed: May 27, 1980

[51] Int. Cl.³ .......................................... H01R 13/12
[52] U.S. Cl. ........................... 339/258 P; 339/17 CF
[58] Field of Search ............ 339/17 C, 17 CF, 17 L, 339/176 MP, 258 R, 258 P

[56] References Cited

U.S. PATENT DOCUMENTS

| | | | |
|---|---|---|---|
| 3,479,634 | 11/1969 | Pritulsky | 339/17 |
| 3,764,955 | 10/1973 | Ward | 339/65 |
| 3,790,916 | 2/1974 | Keitel | 339/17 L |
| 3,907,394 | 9/1975 | Barnes | 339/17 CF |
| 4,066,326 | 1/1978 | Lovendusky | 339/17 C |

FOREIGN PATENT DOCUMENTS

| | | | |
|---|---|---|---|
| 1089838 | 9/1960 | Fed. Rep. of Germany | 339/17 L |
| 2743241 | 3/1978 | Fed. Rep. of Germany | 339/17 CF |

*Primary Examiner*—Joseph H. McGlynn
*Attorney, Agent, or Firm*—Allan B. Osborne

[57] ABSTRACT

The present invention relates to a contact clip which may be attached to a ceramic or other type substrate and which may be plugged into a PCB and thereby provide electrical connections between the substrate and the conductive traces on the board. More particularly, the clip includes a receptacle for receiving the edge of a substrate for mechanical retention and electrical contact, a spring arm which protects the substrate from thermal and mechanical stresses, a low force pluggable pin section for insertion into a board's plated-through hole, and means establishing redundant short electrical paths between the pad on the substrate and the traces on the PCB.

11 Claims, 5 Drawing Figures

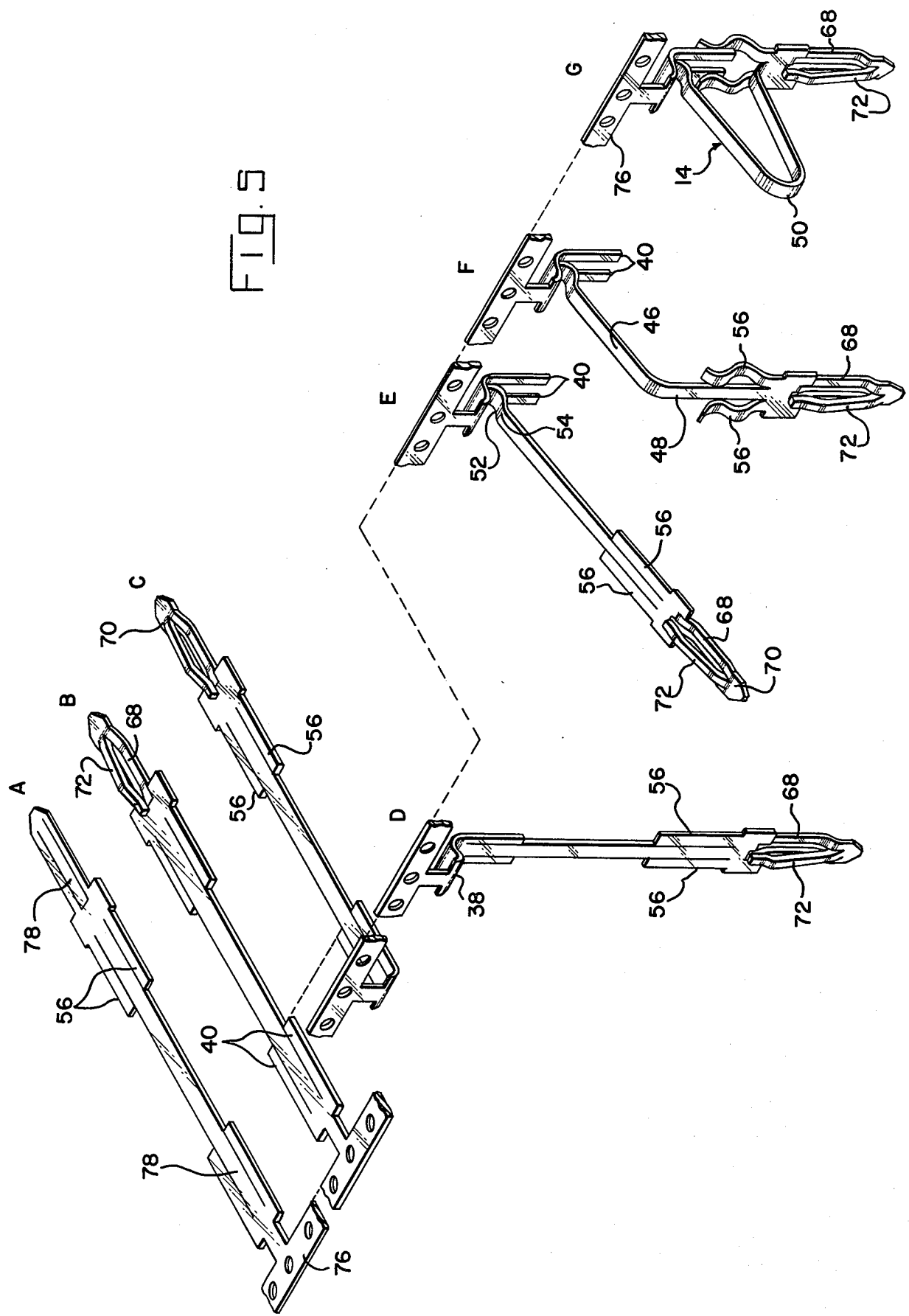

CONTACT CLIP FOR CONNECTING A CERAMIC SUBSTRATE TO A PRINTED CIRCUIT BOARD

BACKGROUND OF THE INVENTION

1. The Field Of The Invention

The present invention relates to electrical devices useful for interconnecting circuitry between an active device substrate and a printed circuit or wiring board.

2. The Prior Art

The present invention is a novel improvement and a departure from at least the following:

| Patent No. | Patentee | Class/Subclass |
|---|---|---|
| 3,479,634 | Pritulsky | 339/17 |
| 3,764,955 | Ward | 339/65 |

Solid state electronic chips such as microprocessors are generally mounted on a substrate of ceramic material. Metalized lines on the substrate provide electrical paths from the very small terminal areas on the electronic chip to larger size pads on the edges of the substrate. The larger size pads more easily facilitate the electrical connections to be made between the substrate and the conductive paths or "traces" on a printed circuit board. The aforementioned prior art patents disclose two connectors for making such electrical connections. In Pritulsky, although the connection is made between a PCB and wires attached to a radio or TV receiver, the connector disclosed can, with little modification, be used to electrically and mechanically connect a substrate to a PCB. The connector of conductive material includes two spaced apart arms bent to provide facing surfaces between which an edge of a PCB is received. The lower member contacts a trace or circuitry on the board edge. Legs integral with the members are adapted for insertion into an aperture on a board of insulative material secured to a radio chassis. Means are included in the connector to receive and terminate wires through which signals are sent to and received from the PCB.

Ward discloses a device specifically designed for holding a substrate and electrically connecting the pads thereon to traces on a PCB. Two spaced apart ears on the device are bent in towards each other and then back in parallel to provide two surfaces between which the edge of the substrate is received. A post integral with the ears is adapted for insertion into a plated-through hole in a PCB to complete the electrical connection.

SUMMARY OF THE INVENTION

The present invention discloses a stamped and formed conductive contact clip having a receptacle for receiving and holding an edge of a substrate and insertion means whereby the clips may be plugged into plated-through holes on a PCB. Further, the clip has a spring arm of considerable length which provides stress-absorbing capabilities. Means are provided on the spring arm so that select soldering techniques may be used to solder the clip to the substrate.

The insertion means on the lower end of the clip adapted for being plugged into a board's plated-through hole preferably includes a pin having three spring members. The pin can be plugged in with relatively low insertion force while still providing excellent electrical contact with the PCB.

With circuit speeds being in nanoseconds, it is imperative that the electrical path between the substrate and board be as short as possible. Accordingly, the contact clip of the present invention includes redundant means which provides a very short path without sacrificing other novel and desirable features noted above.

BRIEF DESCRIPTION OF THE DRAWINGS

FIG. 5 shows the steps of stamping and forming the contact clip of FIG. 1.

DESCRIPTION OF THE INVENTION

Figure 1:
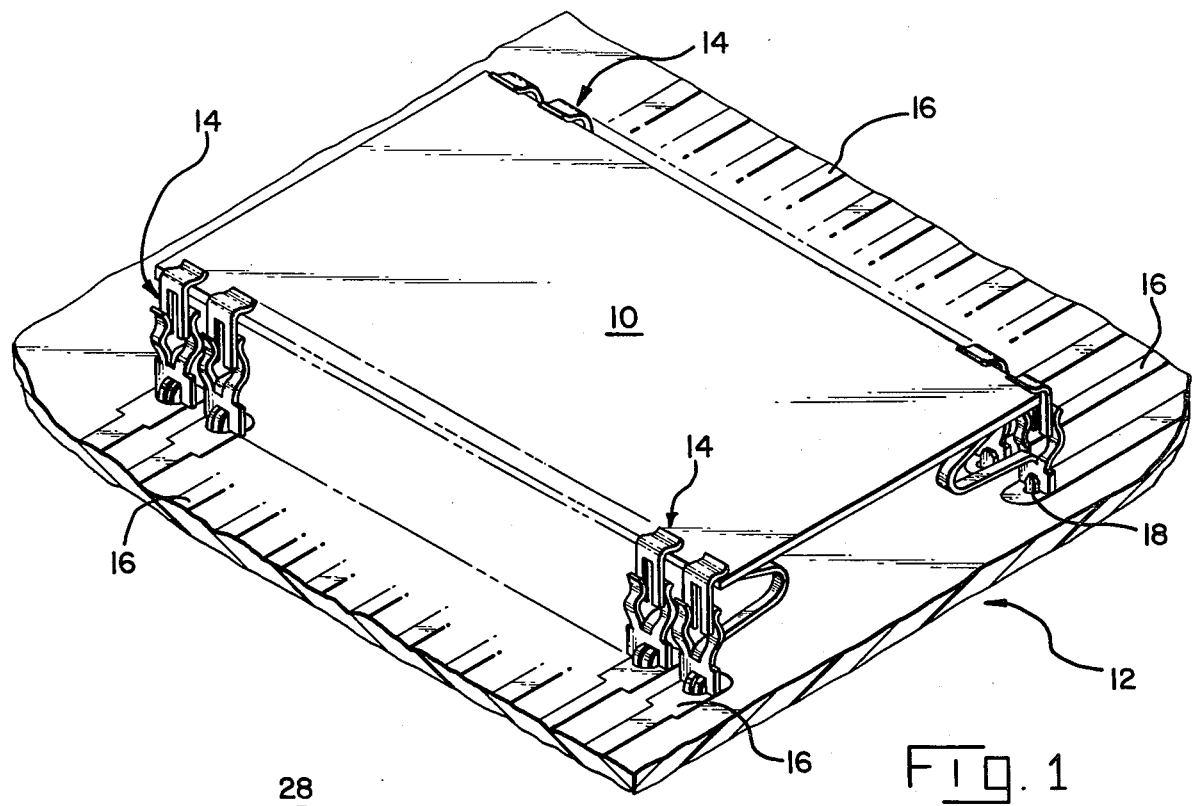
FIG. 1 is a perspective view of a substrate having contact clips of the present invention attached thereto to form an assembly which is shown plugged into a PCB.

In FIG. 1 an active device substrate 10 is mechanically held and electrically connected to PCB 12 by a plurality of contact clips 14 made in accordance with the present invention. The clips electrically connect conductive pads (not shown) on the underside of substrate 10 to traces 16 on the PCB. These traces extend from plated-through holes 18 into which the clips have been inserted.

Figure 2:
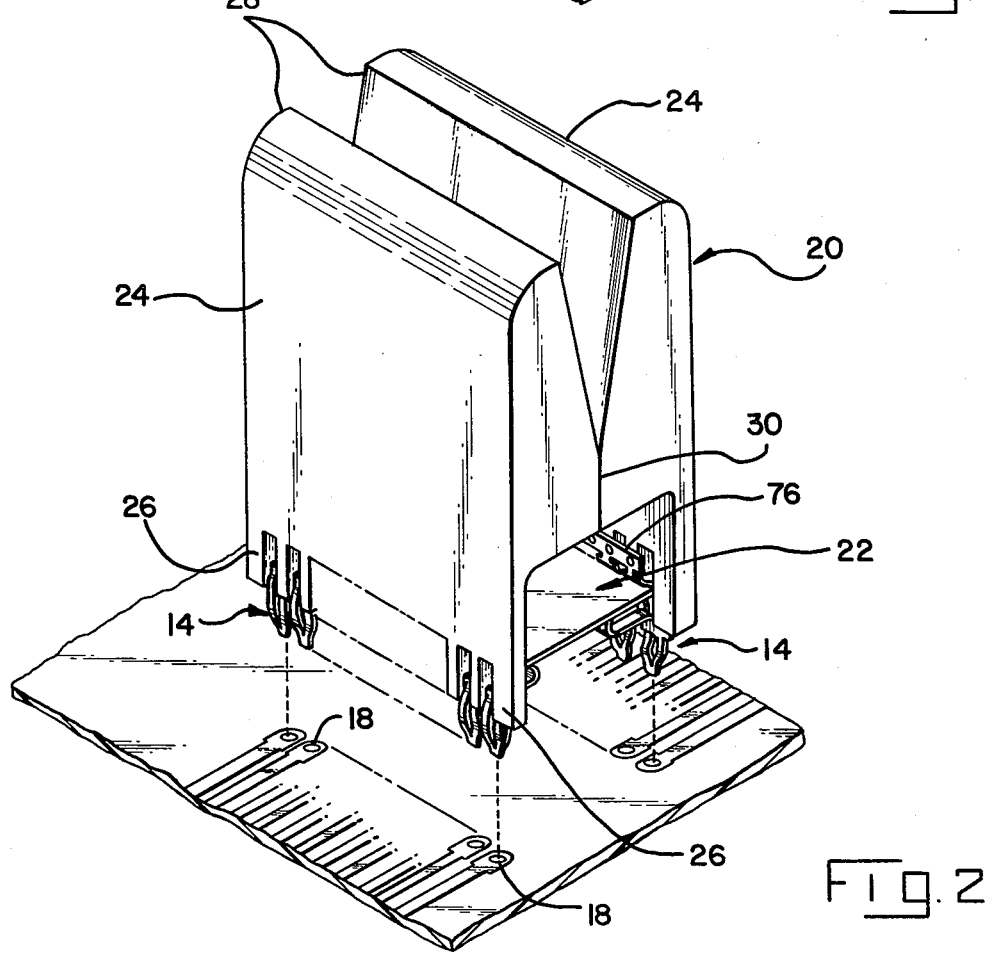
FIG. 2 shows the assembly of FIG. 1 being inserted into the board.

All or at least the majority of substrates are made from a ceramic material which is susceptible to breakage by mishandling. Accordingly, a scissor-like hand tool 20, shown in FIG. 2, provides a means for inserting an assembly 22 which includes the substrate with the required number of contact clips secured thereto. Tool 20, preferably molded from plastic, has two arms 24 with each arm terminating in a toothed front end 26. The two arms are pivotally hinged together intermediate the front and back ends 28. The front ends are biased towards each other so that the tool is self adjusting. The biasing means may be a coil spring (not shown) positioned between the arms behind the hinge line indicated by reference numeral 30. Alternatively, the tool may be molded as one piece with the distance between the toothed front ends being slightly less than the width of assembly 22. The front ends are opened by squeezing in on the two back ends 28. In this embodiment, separate biasing means are not needed nor are the means to pivotally connect the two arms together.

Figure 3:
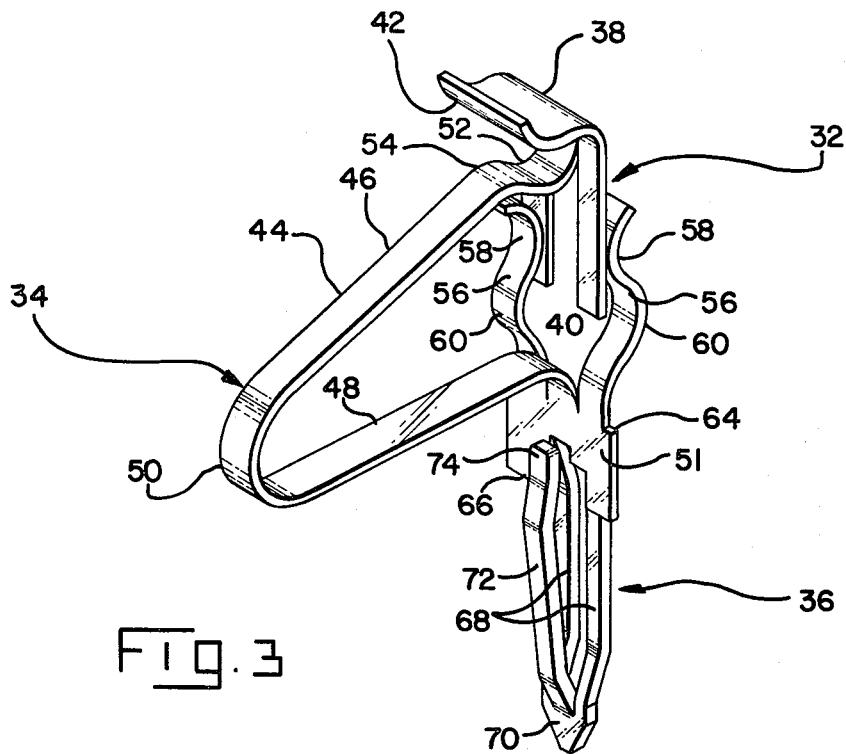
FIG. 3 is a perspective view of the contact clip of FIG. 1.
Figure 4:
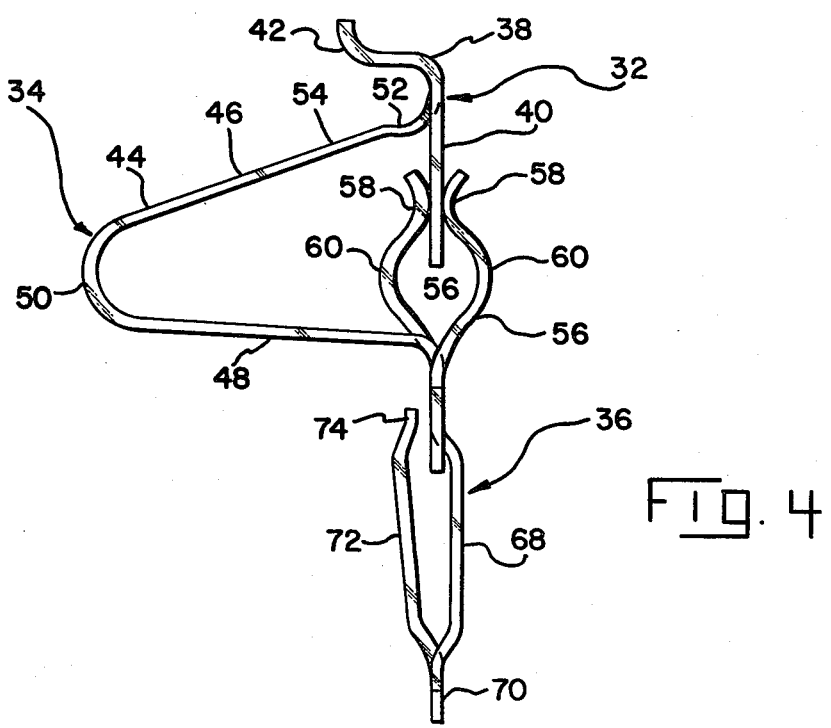
FIG. 4 is a side view of the contact clip of FIG. 1.

FIGS. 3 and 4 are drawings of a much enlarged contact clip 14 so as to illustrate the details thereof clearly.

The contact clip is an elongated length of conductive material such as 0.008 inch (2.03 mm) thick copper-based alloy.

Functionally and structurally the contact clip has three sections: top section 32, intermediate section 34, and lower section 36.

The top section includes upper arm 38 and two, spaced-apart depending first fingers 40. The upper portion of arm 38 is curved to provide a convex surface 42 facing downwardly. The lower end of the top section consists of the two fingers.

The intermediate section consists of a spring having the form of a non-symmetrical nose 44. The nose has an upper limb 46, lower limb 48 and a rounded bight 50 connecting the two limbs. The nose is attached at one end to the top section in between first fingers 40 and at the other end to strap 51 which forms the top of lower section 36. The lower limb 48 of the nose is relatively horizontal or tilted slightly upwards while the upper limb 46 is at an angle of about thirty degrees relative to the lower limb. The attitude of the two limbs given above are preferred; other configurations may be used; e.g., both limbs may be at a forty-five degree angle.

Upper limb 46 has a curved portion 52 adjacent its connection to arm 38. An upwardly facing knob 54 is located next to the curved portion. Knob 54 is the contact point for engagement with a pad on substrate 10 and may be plated with gold, silver, or other suitable plating materials.

Curved portion 52 provides a location for placement of a solder ring if the clips are to be soldered to the substrate.

Strap 51 carries two, upwardly extending second fingers 56, both of which are generally S-shaped but in opposite orientations. These fingers are in registration with first fingers 40 with the apex of the upper curved segment 58 making contact therewith, one segment bearing against one side of a first finger and the segment on the second bearing against the opposite side of the other first finger. The lower and much larger curved segments 60 of the second fingers pre-load the upper segments 58 so that they exert firm, constant pressure against the first fingers for good electrical contact.

The width of strap 51 extends beyond second fingers 56 and the pin portion of the lower section so that there are upwardly facing shoulders 64 and downwardly facing shoulders 66 on both sides. These shoulders provide support for insertion tool 20.

The free end of lower section 36 constitutes a pin portion. This pin portion has three spring members so designed that a low force is sufficient for insertion into hole 18 on the PCB but yet good electrical contact therewith is achieved. Two of the three spring members, indicated by reference numeral 68, are connected at one end to strap 51 at spaced apart locations. They extend downward therefrom converging together to form bevelled tip 70. The third spring member 72 is attached to tip 70 and extends upwardly with its unattached, free end 74 being adjacent strap 51. All three spring members are bowed with the bow orientation on members 68 being opposite that on member 72.

One method of manufacturing contact clips 14 is by stamping and forming them from strip stock metal as a continuous strip. Steps A through G shown in FIG. 5 illustrate the several stages in blanking out and forming up a clip. Carrier strip 76 guides the clips through the dies (not shown) plating lines, reeling, and further, provides a convenient means for gang insertion into a PCB. It is easily broken off at the juncture with upper arm 38.

In step A the clips have been blanked out from the strip of metal (not shown) and the excess material removed. Further, all the cuts have been made as indicated by the lines. Reference numeral 78 indicates two such cut lines. Forming begins with step B where the three spring members on lower section 36 are formed. In step C, the first compound curve is made towards forming upper arm 38 and is completed in step D. The curved portion 52 and knob 54 are formed in step E. Note that this stage also results in defining first fingers 40. The further forming of nose 44 takes place in step F where limb 48 and bight 50 begins to take shape. Limb 46 is now defined. Second fingers 56 are also formed in this step. In step G the final forming of clip 14 occurs by bringing lower section 34 in under and then up towards fingers 44. The free ends of second fingers 56 point outwardly so as they are brought up from below, the curvering portions guides the second fingers up the proper side of the first fingers.

If one or more contact points; i.e., knob 54, curved portions 58, first fingers 40, and spring members 68, 72 are to be plated, the preferred method would be to strip-plate the contact points or areas between steps A and B. Pre-plated stock could also be used.

Assembly may be made by forcing individual contact clips 14 onto the substrate edges with knobs 54 engaging the pads (not shown) on the underside and the convex surface 42 on upper arms 38 positioned on the topside. The dimensions must be so that there is an interference fit. Alternatively, a length of clips connected together by carrier strip 76 can be loaded onto an edge simultaneously. The carrier strip remains with the assembly while it is being inserted into the PCB as shown in FIG. 2. After insertion the strip is broken away.

As is well known, printed circuit boards are subject to mechanical and thermal stresses. Warpage of a board is a common occurrance and can cause non-functioning and even breakage of electronic components on the board. Also, the heat from the electronic device on a substrate can induce thermal stresses into the substrate.

One of the novel features of the present invention; i.e., the elongated nose 44, provides a means for preventing damage to the substrate by absorbing the aforementioned stresses. This spring has a high degree of flexibility so that it can dissipate the stress energies harmlessly.

Another novel feature of the present invention is the short and redundant electrical paths provided by first and second fingers 40 and 56. The signals do not have to follow the elongated nose 44 in getting through the clip.

Still another novel feature of the present invention lies in the adaptability of the clip to be soldered to the substrate.

Yet another novel feature of the present invention lies in lower section 36 and its three spring members. Since a low force is sufficient to plug the pin portion into a plated-through hole, the substrate is not subjected to mechanical stresses in that respect. Further, and not withstanding the low insertion force requirements, the pin portion makes good electrical connection with the PCB.

The present invention may be subject to many modifications and changes without departing from the spirit or essential characteristics thereof. The present embodiments are therefore to be considered in all respects as illustrative and not restrictive of the scope of the invention.

What is claimed is:

1. A contact clip for mounting a substrate to a printed circuit board, said clip comprising, an elongated length of conductive material, its top section being curved around to provide a downwardly facing surface and having a depending first finger, its lower section having a portion adapted for insertion into a hole in a printed circuit board and further having a second finger extending upwardly and slidingly engaging the first finger to provide an electrical signal path therebetween, and its intermediate section formed into an elongated, outwardly projecting nose consisting of an upper limb attached to and extending obliquely downwardly from the top section, a lower limb attached to and extending outwardly from the lower section, and a bight connecting the two limbs, said downwardly facing surface of the top section cooperating with the top surface of the upper limb to provide a receptacle for an edge of a substrate.

2. The contact clip of claim 1 further including a another first finger attached to the top section with the two first fingers being positioned on either side of the attachment of the upper limb, and another second finger attached to the lower section with the two second fingers being positioned on either side of the attachment of the lower limb, said two first and two second fingers being in sliding contact to provide two paths for an electrical signal passing through the clip.

3. The contact clip of claim 2 wherein one of the second fingers makes sliding contact with one of the first fingers on a side opposite to the side slidingly contacted by the another second finger on the other first finger.

4. The contact clip of claim 1, 2, or 3 wherein each of the second fingers are generally S-shaped with the apex of the upper curve engaging each of the first fingers and with the free ends pointing outwardly from the first fingers.

5. A contact clip for mechanically and electrically connecting a substrate to a printed circuit board, said clip comprising:
   a. a top section with its upper portion formed around to provide a downwardly facing convex surface and a lower vertical portion having a first finger depending therefrom;
   b. a lower section with a lower end adapted for insertion into a plated-through hole in a printed circuit board and an upper portion having a second finger extending vertically upwardly to slidingly engage the first finger; and
   c. an intermediate section consisting of outwardly projecting, resilient upper and lower limbs with their outer ends joined together and with the inner end of the upper limb attached to the top section and the inner end of the lower limb attached to the upper portion on the lower section, further, the upper limb having an upwardly facing convex surface which cooperates with the downwardly facing convex surface to provide a receptacle for an edge of a substrate.

6. The contact clip of claim 5 with one of said fingers being generally S-shaped with the apex of one curve thereof engaging the other finger to provide an electrical path therethrough.

7. The contact clip of claim 6 further including a location on the upper limb adjacent to its attachment to the top section for receiving solder whereby the clip may be soldered to the substrate.

8. The contact clip of claim 5 wherein the lower end on the lower section includes three outwardly-bowed, vertically extending spring members, two of said members being positioned on one side of the longitudinal axis of the clip and the third member being positioned on the opposite side.

9. The contact clip of claim 8 wherein one end of the third spring member is attached to the lower end and the other end is unattached.

10. A method of making a contact clip for connecting a substrate to a printed circuit board, comprising the steps of:
    a. stamping from flat stock a predetermined shape having top, intermediate and lower sections;
    b. slitting the free end of the lower section to define three parallel segments;
    c. forming a pin for insertion into a circuit board by bowing the three parallel segments outwardly with the middle segment being bowed in one direction and the side segments being bowed in the opposite direction;
    d. bending the free end of the top section into a horizontal S-shaped curve;
    e. bending the intermediate section to form a laterally extending nose-shaped compliant section, the bending being such so as to bring the top and lower sections closer and in vertical alignment with each other and to form a substrate-edge receptacle between the S-shaped curve and the portion of the intermediate section adjacent its connection with the top section;
    f. providing a first finger extending downwardly from the top section and a second finger extending upwardly from the lower section;
    g. bending the second finger into an S-shaped curve; and
    h. biasing the first and second fingers together to provide sliding electrical engagement therebetween.

11. The method of claim 10 wherein the additional steps set forth therein provides two first fingers, one on either side of the attachment between the top and intermediate sections and two second fingers, one on either side of the attachment between the intermediate and lower sections.

* * * * *